United States Patent [19]

Omori et al.

[11] Patent Number: 5,363,274
[45] Date of Patent: Nov. 8, 1994

[54] MEMORY CARD

[75] Inventors: Makoto Omori; Jun Ohbuchi; Hajime Maeda; Yasushi Kasatani, all of Itami, Japan

[73] Assignee: Mitsubishi Denki Kabushiki Kaisha, Tokyo, Japan

[21] Appl. No.: 836,712

[22] Filed: Feb. 19, 1992

[30] Foreign Application Priority Data

Feb. 19, 1991 [JP] Japan ................. 3-023645

[51] Int. Cl.$^5$ ............................................. H05K 1/14
[52] U.S. Cl. ........................................ 361/736; 361/684; 361/737
[58] Field of Search ................ 361/390, 391, 392, 395, 361/399, 415, 724, 725, 728, 730, 736–737, 752, 796; 174/250, 255, 260, 52.1, 52.3, 52.4; 257/679

[56] References Cited

U.S. PATENT DOCUMENTS

| | | | |
|---|---|---|---|
| 4,532,419 | 7/1985 | Takeda | 235/492 |
| 4,780,604 | 10/1988 | Hasegawa et al. | 235/492 |
| 4,791,608 | 12/1988 | Fushimoto | 365/52 |
| 4,890,197 | 12/1989 | Banjo et al. | 361/492 |
| 4,933,537 | 6/1990 | Takahashi et al. | 235/454 |
| 5,038,250 | 8/1991 | Uenaka et al. | 361/495 |
| 5,057,679 | 10/1991 | Audic et al. | 235/492 |
| 5,061,845 | 10/1991 | Pinnauaia | 361/395 |
| 5,153,818 | 10/1992 | Mukougawa et al. | 361/395 |
| 5,198,652 | 3/1993 | Rose | 235/492 |

*Primary Examiner*—Leo P. Picard
*Assistant Examiner*—Bot Ledynh
*Attorney, Agent, or Firm*—Leydig, Voit & Mayer

[57] ABSTRACT

A memory card having no ordinary type circuit board and a reduced thickness. Insulating layers are disposed on reverse surfaces of a pair of metallic panels, and circuit patterns are formed on the insulating layers. A plurality of electronic parts are mounted on the metallic panels by, for example, being soldered to the circuit patterns. The pair of metallic panels on which the electronic parts are mounted are fitted and bonded to openings formed in a frame of the card so that the electronic parts are accommodated inside the frame facing each other.

14 Claims, 2 Drawing Sheets

MEMORY CARD

BACKGROUND OF THE INVENTION

1. Field of the Invention

This invention relates to the structure of a memory card used as an external memory medium for a computer or the like.

2. Description of the Related Art

FIG. 4 is a perspective view of a memory card of this kind. A circuit board (refer to FIG. 5) on which electronic parts are mounted is placed in a frame 3 which constitutes an accommodation means. Metallic panels 4 are provided on the upper and lower sides of the frame 3 so as to cover the circuit board. A plurality of terminals 6 for electrical connection between the electronic parts in the frame 3 and an external unit outside the card are provided in a side surface of the frame 3 facing in the direction of insertion into the external unit.

FIG. 5 is a vertical cross-sectional view taken along the line A—A of FIG. 4 and shows the internal construction of a conventional memory card 10. Circuit patterns (not shown) are formed on the two surfaces of a circuit board 1, and a plurality of electronic parts 2 are mounted on the circuit board 1 by soldering or the like. The circuit board 1 is supported on a support portion of a resin frame 3 extending so as to define an inner peripheral surface of the frame 3, and is fixed by an engagement portion (not shown). Metallic panels 4 for protecting the electronic parts 2 from external static electricity and other influences are provided on the upper and lower sides of the frame 3. Metallic panels 4 are fitted in recesses 3b formed along inner edges of the frame 3 defining upper and lower openings 3a of the frame 3, and are fixed by a bonding agent or the like (not shown).

In the thus-constructed conventional memory card, the overall thickness of the card is the sum of at least the thicknesses of the circuit board, the two electronic parts mounted on the obverse and reverse surfaces of the circuit board and the pair of upper and lower metallic panels, and is, therefore, relatively large.

SUMMARY OF THE INVENTION

In view of this problem, an object of the present invention is to provide a memory card of reduced thickness.

In order to achieve the above object, according to the present invention, there is provided a memory card incorporating an electronic part, comprising a circuit means having at least one electronic part mounted on a reverse surface of a metallic panel having obverse and reverse surfaces, a thin insulating layer being interposed between the electronic part and the reverse surface of the metallic panel; an accommodation means to which the circuit means is fitted on at least one of upper and lower sides thereof so that the obverse surface of the metallic panel is exposed outside the card and that the electronic part is accommodated in the accommodation means, the accommodation means having the minimum height sufficient to accommodate the circuit means; and an electrical connection means for electrical connection between the electronic part and the outside of the card, the electrical connection means being disposed on the accommodation frame means.

According to the present invention, the circuit means including a metallic panel having a reverse surface on which a thin insulating film is disposed on which a circuit pattern is formed and electronic parts are mounted is fitted and bonded to a resin frame having the minimum height sufficient to accommodate the circuit means, thus forming the memory card. There is therefore no need for a separate circuit board.

DESCRIPTION OF THE PREFERRED EMBODIMENTS

Embodiments of the present invention will be described below with reference to the accompanying drawings.

Figure 1:
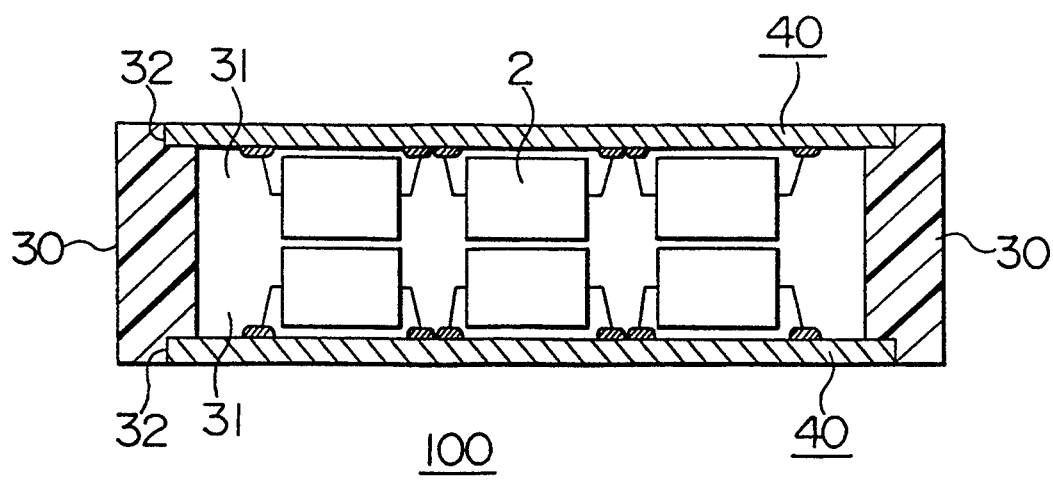
FIG. 1 is a vertical cross-sectional view of the internal construction of a memory card in accordance with an embodiment of the present invention.
Figure 2:
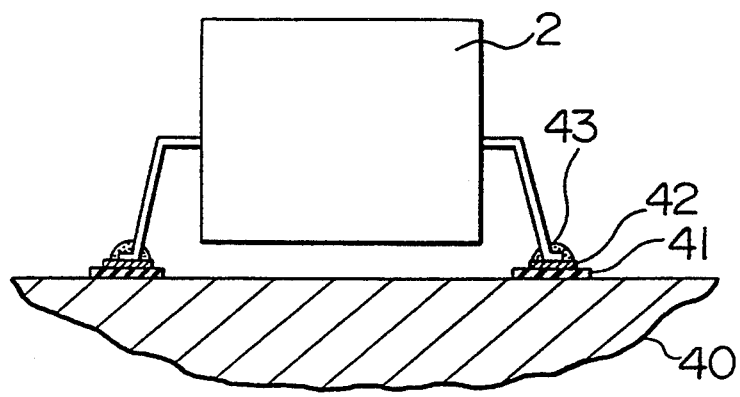
FIG. 2 is an enlarged cross-sectional view of an electronic mounted part on the metallic panel of the memory card shown in FIG. 1.
Figure 4:
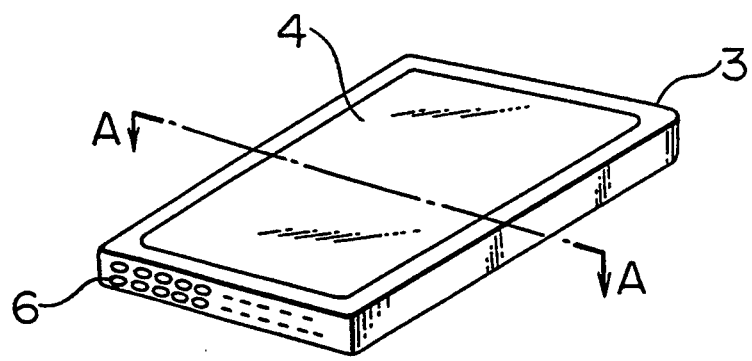
FIG. 4 is a perspective view of a memory card of the kind concerned.
Figure 5:
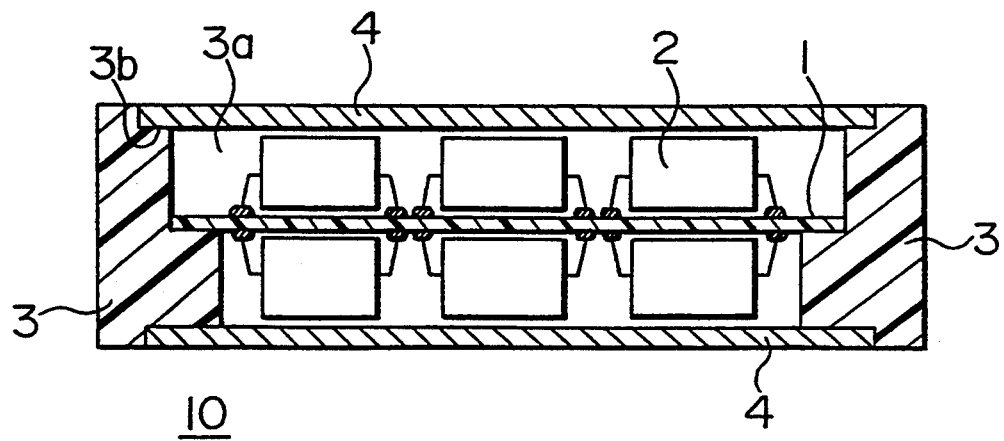
FIG. 5 is a vertical cross-sectional view of a conventional memory card.

FIG. 1 is a vertical cross-sectional view taken along the line A—A of FIG. 4, and shows the internal construction of a memory card in accordance with an embodiment of the present invention. FIG. 2 is an enlarged cross-sectional view of the mounted electronic parts. A circuit means includes metallic panels 40, insulating layers 41, circuit patterns 42, solder 43 and electronic parts 2. An accommodation means includes a frame 30 having upper and lower openings 31. In this memory card 100 of the present invention, external connection terminals of an electrical connection means are also provided in a side surface of the frame 30, as shown in FIG. 4.

Referring again to FIG. 1, the frame 30 is formed of a resin frame member having the openings 31 in its upper and lower faces, and recesses 32 in which the metallic panels 40 are to be fitted are formed along the frame edges defining the openings 3. The metallic panels 40 are bonded to the frame 30 by an adhesive (not shown) and fitted in the recesses 32. Preferably, the recesses 32 have a depth such that the obverse surface of each metallic panel 40 is flush with the outer surface of the frame 30 when the metallic panel is fitted in the recess 32. A plurality of electronic parts 2 is mounted on the reverse surface of each of the metallic panels 40.

FIG. 2 shows the mounted state of the electronic parts. Thin insulating layer 41 having a thickness of about 10 to 20 microns is formed on the reverse surface of each metallic panel 40, and circuit pattern 42 is formed on the insulating layer 41 by, for example, aluminum deposition. The insulating layer 41 may be formed on necessary portions corresponding to circuit patterns 42 alone, or may be formed on the whole reverse surface of the metallic panel 40. Electronic parts 2 are mounted and connected to the circuit patterns 42 by soldering.

As shown in FIG. 1, the two metallic panels 40 on which the electronic parts 2 are mounted are attached to the upper and lower sides of the frame 30 so that the electronic parts 2 mounted on them face each other. Preferably, the frame 30 has the minimum height necessary for accommodating the pair of upper and lower metallic panels 40 on which the electronic parts 2 are mounted.

Figure 3:
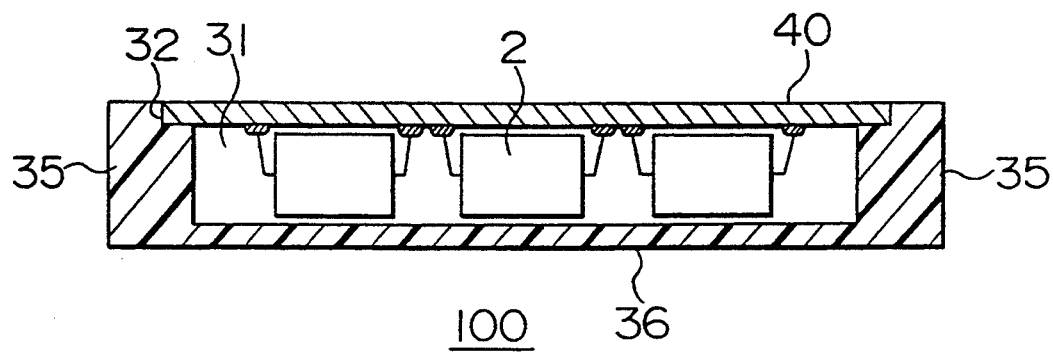
FIG. 3 is a vertical cross-sectional view of the internal construction of a memory card in accordance with another embodiment of the present invention.

FIG. 3 is a vertical cross-sectional view of a memory card in accordance with another embodiment of the present invention. In this embodiment, a panel 40 on which electronic parts 2 are mounted is attached to a frame 35 on the upper side alone. The lower face of the card is defined by a plate 36 which is formed of the same material as the frame 35 and is unitary with the frame 35. The arrangement may alternatively be such that openings are formed in the frame on the upper and lower sides as in the first embodiment, and that a metallic panel on which electronic parts are mounted is fitted to one of the openings while another metallic panel on which no electronic parts are mounted is fitted to the other opening to protect the electronic parts from external static electricity. Preferably, in this case, the frame has the minimum height necessary for accommodating one metallic panel on which electronic parts are mounted.

The means for forming circuit pattern 42 on the insulating layer 41 is not limited to aluminum deposition used in the above-described embodiment. For circuit pattern formation, a metallic pattern, e.g., a copper pattern previously formed may be bonded to the insulating layer, or circuit patterns may be formed by a method using a metallic foil etching, e.g., copper foil etching.

As described above, the memory card of the present invention is constructed without using any separate circuit board and can therefore be reduced in thickness.

What is claimed is:

1. A memory card incorporating an electronic part comprising:
   a metallic panel having obverse and reverse surfaces;
   circuit means including at least one electronic part, an insulating layer 10 to 20 microns thick disposed on the reverse surface of the metallic panel, and a circuit pattern disposed on the insulating layer, the circuit pattern having a shape and the insulating layer having the same shape as the circuit pattern, the electronic part being mounted on and connected to the circuit pattern;
   accommodation means comprising a resin frame for accommodating the electronic part and having upper and lower sides, the upper side having an opening into which the metallic panel is fitted so that the obverse surface of the metallic panel is exposed outside the card and that the electronic part is disposed within the accommodation means, the accommodation means having a height between the upper and lower sides sufficient to accommodate the circuit means; and
   electrical connection means for electrical connection to the electronic part from outside of the card, the electrical connection means being disposed on the accommodation means.

2. The memory card according to claim 1 wherein the circuit pattern on the insulating layer is aluminum.

3. The memory card according to claim 1 wherein the circuit pattern on the insulating layer is formed by metallic pattern bonding.

4. The memory card according to claim 1 wherein the circuit pattern on the insulating layer is a metallic foil.

5. The memory card according to claim 1 wherein the electronic part is soldered to the circuit pattern.

6. The memory card according to claim 1 wherein the frame includes an opening on each of the upper and lower sides of the frame and including a second metallic panel and circuit means, the second metallic panel being fitted in the opening in the lower side of the frame, the metallic panels being bonded to the frame.

7. The memory card according to claim 1 wherein the frame is unitary and includes a resin plate opposite the metallic panel.

8. The memory card according to claim 1 wherein the frame includes an opening on each of the upper and lower sides and a second metallic panel is fitted in the opening on the lower side for protecting the electronic part.

9. A memory card incorporating an electronic part comprising:
   a metallic panel having obverse and reverse surfaces;
   circuit means including at least one electronic part, an insulating layer 10 to 20 microns thick disposed on the reverse surface of the metallic panel, and a circuit pattern disposed on the insulating layer, the electronic part being mounted on and connected to the circuit pattern;
   accommodation means comprising a resin frame for accommodating the electronic part and having upper and lower sides, the upper side having an opening into which the metallic panel is fitted so that the obverse surface of the metallic panel is exposed outside the card and that the electronic part is disposed within the resin frame, the resin frame having a height between the upper and lower sides sufficient to accommodate the circuit means, an opening on the upper side into which the metallic panel is fitted, and a recess around the opening so that the obverse surface of the metallic panel is flush with the frame; and
   electrical connection means for electrical connection to the electronic part from outside of the card, the electrical connection means being disposed on the accommodation means.

10. A memory card incorporating an electronic part comprising:
    a metallic panel having obverse and reverse surfaces, a thin insulating layer disposed on and covering part of the reverse surface of the metallic panel in a pattern, and a circuit pattern of electrical conductors disposed on the insulating layer pattern and thereby electrically insulated from the metallic panel, and an electronic part mounted on and electrically connected to the circuit pattern wherein the circuit pattern has a shape and the insulating layer pattern has the same shape as the circuit pattern;
    accommodation means comprising a resin frame for accommodating the electronic part and having upper and lower sides, the upper side having an opening into which the metallic panel is fitted so that the obverse surface of the metallic panel is exposed outside the card and that the electronic part is disposed within the accommodation means, the accommodation means having a height between the upper and lower sides sufficient to accommodate the circuit means; and
    electrical connection means for electrical connection to the electronic part from outside of the card, the electrical connection means being disposed on the accommodation means.

11. The memory card according to claim 10 wherein the frame includes an opening on each of the upper and lower sides of the frame and including a second of the metallic panels fitted in the opening in the lower side of the frame.

12. The memory card according to claim 10 wherein the frame is unitary and includes a resin plate opposite the metallic panel.

13. The memory card according to claim 10 wherein the frame includes an opening on each of the upper and lower sides and a second metallic panel is fitted in the opening in the lower side for protecting the electronic part.

14. A memory card incorporating an electronic part comprising:

a metallic panel having obverse and reverse surfaces, a thin insulating layer disposed on and covering part of the reverse surface of the metallic panel in a pattern, and a circuit pattern of electrical conductors disposed on the insulating layer pattern and thereby electrically insulated from the metallic panel, and an electronic part mounted on and electrically connected to the circuit pattern;

accommodation means comprising a resin frame for accommodating the electronic part having upper and lower sides, the upper side having an opening into which the metallic panel is fitted so that the obverse surface of the metallic panel is exposed outside the card and that the electronic part is disposed within the resin frame, the resin frames having a height between the upper and lower sides sufficient to accommodate the circuit means, an opening on the upper side into which the metallic panel is fitted, and a recess around the opening so that the obverse surface of the metallic panel is flush with the frame; and electrical connection means for electrical connection to the electronic part from outside of the card, the electrical connection means being disposed on the accommodation means.

* * * * *